(12) United States Patent
Hinrichs et al.

(10) Patent No.: US 12,117,394 B2
(45) Date of Patent: Oct. 15, 2024

(54) LUMINOPHORE, PROCESS FOR PRODUCING A LUMINOPHORE, OPTOELECTRONIC COMPONENT AND NIR SPECTROMETER

(71) Applicant: ams-OSRAM International GmbH, Regensburg (DE)

(72) Inventors: Dominik Hinrichs, Grossaitingen (DE); Tobias Tyborski, Augsburg (DE); Sonja Tragl, Augsburg (DE)

(73) Assignee: ams-Osram International GmbH, Regensburg (DE)

( * ) Notice: Subject to any disclaimer, the term of this patent is extended or adjusted under 35 U.S.C. 154(b) by 302 days.

(21) Appl. No.: 17/798,577

(22) PCT Filed: Jan. 20, 2021

(86) PCT No.: PCT/EP2021/051182
§ 371 (c)(1),
(2) Date: Aug. 10, 2022

(87) PCT Pub. No.: WO2021/160390
PCT Pub. Date: Aug. 19, 2021

(65) Prior Publication Data
US 2023/0113047 A1 Apr. 13, 2023

(30) Foreign Application Priority Data
Feb. 10, 2020 (DE) .................. 10 2020 201 617.8

(51) Int. Cl.
*C01F 17/241* (2020.01)
*C01G 15/00* (2006.01)
(Continued)

(52) U.S. Cl.
CPC ......... *G01N 21/359* (2013.01); *C01F 17/241* (2020.01); *C01G 15/006* (2013.01);
(Continued)

(58) Field of Classification Search
CPC ... G01N 21/359; C01F 17/241; C01G 15/006; C09K 11/7701; C09K 11/7769;
(Continued)

(56) References Cited

U.S. PATENT DOCUMENTS

2001/0035521 A1  11/2001  Oshima et al.
2010/0032935 A1   2/2010  Heer et al.
(Continued)

FOREIGN PATENT DOCUMENTS

CN   102051175 A    5/2011
WO   2020169601 A1  8/2020

OTHER PUBLICATIONS

Chen, Jinquan et al., "Local Structure Modulation Induced Highly Efficient Far-Red Luminescence of La1—xLuxAlO3:Mn4+ for Plant Cultivation", Inorganic Chemistry, 2019, pp. 8379-8387, American Chemical Society.
(Continued)

*Primary Examiner* — Courtney D Thomas
(74) *Attorney, Agent, or Firm* — Viering, Jentschura & Partner mbB; Benjamin L. von Rueden

(57) ABSTRACT

A luminophore may have the general formula $A_xM_yX_z$:RE. A may be selected from the group of the trivalent cations. M may be selected from the group of the trivalent cations and includes at least two elements from the following group: Ga, Sc, Al, In, Sb, Bi, As, and Lu. X may be selected from the group of the divalent anions. RE may be a dopant and may be selected from the group formed by the following elements and the combinations of the following elements: Ni, Mn, Cr, Co, Fe, and Sn, where $0.8 \leq x \leq 1.2$, $0.8 \leq y \leq 1.2$ and $2.7 \leq z \leq 3.3$.

(Continued)

A process is also disclosed for producing a luminophore, an optoelectronic component, and an NIR spectrometer.

20 Claims, 6 Drawing Sheets

(51) Int. Cl.
 *C09K 11/77* (2006.01)
 *G01N 21/359* (2014.01)
(52) U.S. Cl.
 CPC ...... *C09K 11/7701* (2013.01); *C09K 11/7769* (2013.01); *C01P 2002/34* (2013.01); *C01P 2002/52* (2013.01); *C01P 2002/72* (2013.01); *C01P 2004/03* (2013.01)
(58) Field of Classification Search
 CPC .............. C01P 2002/34; C01P 2002/52; C01P 2002/72; C01P 2004/03; H01L 33/502; H01L 33/501; H01L 33/504; H01L 33/507
 See application file for complete search history.

(56) References Cited

U.S. PATENT DOCUMENTS

2018/0066186 A1* 3/2018 Zych ...................... C09K 11/59
2018/0155621 A1* 6/2018 Zych ...................... H01L 33/502

OTHER PUBLICATIONS

International Search Report issued for the corresponding International patent application No. PCT/EP2021/051182, dated Apr. 6, 2021, 5 pages (for informational purposes only).
Fang, Mu-Huai et al., "Penetrating Biological Tissue Using Light-Emitting Diodes with a Highly Efficient Near-Infrared ScBO3:Cr3+ Phosphor", Chemistry of Materials, 2020, pp. 2166-2171, American Chemical Society.
Habib, Z et al., "Influence of Ni substitution at B-site for Fe3+ ions on morphological, optical, and magnetic properties of HoFeO3 ceramics", Applied Physics A, 2016, 8 pages.
German Seach Report issued fo the German patent application No. 10 2020 201 617.8, dated Nov. 12, 2020, 7 pages (for informational purposes only).
Thimsen, Elijah et al., "Shortwave-infrared (SWIR) emitters for biological imaging: a review of challenges and opportunities", Nanophotonics, 2017, pp. 1043-1054.
Takeda, Yasuhiko et al., "A broadband-sensitive upconverter La(Ga0. 5Sc0.5)O3:Er, Ni,Nb for crystalline silicon solar cells", Applied Physics Letters, Jan. 2016, 5 pages.
AP Technologies "NIR LED Thermal Effecfts", retrieved on Oct. 7, 2019, 1 page.
Maruo, Katsuhiko et al., "Near-infrared noninvasive blood glucose prediction without using multivariate analyses: Introduction of imaginary spectra due to scattering change in the skin", Journal of Biomedical Optics, Apr. 2015, 12 pages.
Huang, Haibo et al., "Near infrared spectroscopy for on in-line monitoring of quality in foods and beverages", Science Direct, 2008, pp. 303-313, Elsevier.
Dilley, Joshua D. et al., "The Use of Near-Infrared Spectroscopy as a Substitute for Blood Pressure Monitoring in a Patint with Severe Osteogenesis Imperfecta", Open Journal of Anesthesiology, 2012, pp. 195-197, Scientific Research.
Hollemann/ Wiberg, "1.4 Sauerstoffverbindungen des Bors", 2017, 3 pages (including 2 pages English machine translation), Holleman/ Wiberg's Inorganic Chemistry. vol. 1: Fundamentals and Main Group Elements, De Gruyter, Issue 103, vol. 1.
Mueller, Ulrich, "16 Kugelpackungen mit besetzten Lucken", 1991, 6 pages (including 4 pages English machine translation), Anorganische Strukturchemie.
German Search Report issued for the corresponding DE patent application No. DE 11 2021 000 965.6, dated Jun. 29, 2023, 7 pages (For informational purposes only).
Du, J., et al.: "Near-infrared persistent luminescence in Mn4+ doped perovskite type solid solutions", Elsevier, Ceramics International, 2019, vol. 45, Issue 7, Part A, pp. 8345-8353, ISSN 0272-8842.
Takeda, Y., et al.: "Energy transfer between Ni2+ sensitizers and Er3+ emitters in broadband-sensitive upconverters La(Ga,Sc,In)O3:Er,Ni,Nb", Journal of Applied Physics, 2016, vol. 120, Issue 7, 073102-1-7, ISSN 1089-7550.
Xu, J., et al.: "Toward tunable and bright deep-red persistent luminescene of Cr3+ in garnets", Journal American Ceramic Society, 2017, vol. 100, Issue 9, pp. 4033-4044, ISSN 1551-2916.

* cited by examiner

LUMINOPHORE, PROCESS FOR PRODUCING A LUMINOPHORE, OPTOELECTRONIC COMPONENT AND NIR SPECTROMETER

CROSS-REFERENCE TO RELATED APPLICATIONS

The present application is a national stage entry according to 35 U.S.C. § 371 Of PCT application No.: PCT/EP2021/051182 filed on Jan. 20, 2021; which claims priority to German Patent application No.: 10 2020 201 617.8, filed on Feb. 10, 2020; all of which are incorporated herein by reference in their entirety and for all purposes.

TECHNICAL FIELD

A luminophore and a process for producing a luminophore are specified. Additionally specified are an optoelectronic component and an NIR spectrometer (short for "near-infrared spectrometer").

BACKGROUND

One objective to be achieved is that of specifying a luminophore having elevated efficiency. In addition, a process for producing such a luminophore is to be specified. Furthermore, an optoelectronic component having elevated efficiency and an NIR spectrometer comprising such a component are to be specified.

SUMMARY

Advantageous embodiments of the luminophore, of the process, of the optoelectronic component and of the NIR spectrometer are the subject of the respective dependent claims.

In one embodiment, the luminophore has the general formula $A_xM_yX_z$:RE.

In at least one embodiment of the luminophore, A is selected from the group of the trivalent cations. In at least one embodiment of the luminophore, A is selected from the group of the trivalent cations and combinations of the trivalent cations. For example, A includes exactly two trivalent cations.

What is meant by the term "valency" in relation to a particular element in the present context is how many elements having a single opposite charge are required in a chemical compound to achieve balancing of the charge. Thus, the term "valency" comprises the charge number of the element.

Cations having a valency of three have a triple positive charge in the chemical compound. This means that three further elements or three atoms of one element that have a single negative charge in the chemical compound, or one further element having a triple negative charge the chemical compound, may bind to the trivalent cation. This leads to balancing of charge. Trivalent cations in the present context may be selected from the group formed by the scandium group, titanium group, vanadium group, chromium group, manganese group, ion group, cobalt group, nickel group, copper group, zinc group, group of lanthanoids, and boron group.

In at least one embodiment of the luminophore, M is selected from the group of the trivalent cations.

In at least one embodiment of the luminophore, M is selected from the group of the trivalent cations and combinations of the trivalent cations. For example, M includes exactly two trivalent cations. For example, M represents scandium and gallium.

In at least one embodiment of the luminophore, X is selected from the group of the divalent anions. X may be selected from the group of the chalcogenide anions. X may be selected from the group of the divalent anions and combinations thereof. For example, X includes exactly two divalent anions.

Anions having a valency of two have a double negative charge in the chemical compound. This means that it is possible for two further elements or two atoms of one element that have a single positive charge in the chemical compound, or one further element having a double positive charge in the chemical compound, to bind to the divalent anion. This leads to balancing of the charge.

In at least one embodiment of the luminophore, RE is a dopant and is selected from the group formed by the following elements and the combinations of the following elements: Ni, Mn, Cr, Co, Fe and Sn. For example, RE includes exactly two of these elements.

In at least one embodiment of the luminophore: $0.8 \leq x \leq 1.2$; $0.8 \leq y \leq 1.2$ and $2.7 \leq z \leq 3.3$.

Luminophores are described herein and hereinafter with reference to empirical formulae. In the empirical formula specified, it is possible that the luminophore includes further elements, for instance in the form of impurities, in which case these impurities together account for most 1 permille, such as not more than 100 ppm (parts per million), or not more than 10 ppm.

The luminophore may include a crystalline host material into which extraneous elements are introduced as dopants.

The host material alters the electronic structure of the dopant in that electromagnetic radiation in an excitation spectrum is absorbed by the luminophore and induces electronic transition in the luminophore, which is converted back to the ground state with emission of electromagnetic radiation in an emission spectrum. The dopant introduced into the host material is responsible in this way for the wavelength-converting properties of the luminophore.

What is meant by the term "wavelength-converting" in the present context is that incident electromagnetic radiation of a particular wavelength range, in the present context with an excitation spectrum, is converted to electromagnetic radiation of a different, such as longer-wave, wavelength range, in the present context with an emission spectrum. In general, a wavelength-converting component absorbs electromagnetic radiation of an incident wavelength range, converts this by electronic processes at the atomic and molecular level to electromagnetic radiation of another wavelength range, and emits the converted electronic radiation again. In particular, pure scatter or pure absorption is not considered to be wavelength-converting in the present context.

For example, the luminophore is in particle form with grain sizes between 1 micrometer and 50 micrometers inclusive. The grain size may be between 1 micrometer and 30 micrometers inclusive.

The crystalline host material may be formed from a generally periodically repeating three-dimensional unit cell. In other words, the unit cell is the smallest repeating unit in the crystalline host material. The elements A, M and X here each occupy fixed sites, called point positions, in the three-dimensional unit cell of the host material. The dopant RE and the elements A and M here may occupy equivalent point positions. This means that either A or M or RE is at said point position in a unit cell.

In at least one embodiment, the luminophore has the general formula $A_xM_yX_z$:RE where A is selected from the group of the trivalent cations, M is selected from the group of the trivalent cations, X is selected from the group of the divalent anions and RE is a dopant and is selected from the group, formed by the following elements and the combinations of the following elements: Ni, Mn, Cr, Co, Fe and Sn, where $0.8 \leq x \leq 1.2$; $0.8 \leq y \leq 1.2$ and $2.7 \leq z \leq 3.3$.

In at least one embodiment, the luminophore has the general formula $A_xM_yX_z$:RE where A is selected from the group of the trivalent cations and combinations of the trivalent cations, M is selected from the group of the trivalent cations and combinations of the trivalent cations, X is selected from the group of the divalent anions and combinations of the divalent anions and RE is a dopant and is selected from the group, formed by the following elements and the combinations of the following elements: Ni, Mn, Cr, Co, Fe and Sn, where $0.8 \leq x \leq 1.2$; $0.8 \leq y \leq 1.2$ and $2.7 \leq z \leq 3.3$.

In at least one embodiment, the luminophore has the general formula $A_xM_yD_dE_eF_fX_z$ where D, E and F are selected from the group formed by the following elements: Ni, Mn, Cr, Co, Fe and Sn, and $0.8 \leq y+d+e+f \leq 1.2$; $0 \leq d \leq 0.1$; $0 \leq e \leq 0.1$; $0 \leq f \leq 0.1$ and $d+e+f>0$. In an embodiment, D, E and F are dopants and are selected from the same group as the dopant RE. The ratio of the individual elements D, E and F to one another here is specified.

In an embodiment, x is set to 1 and (y+d+e+f) is likewise set to 1 and z is set to 3. For example, D corresponds to the element Ni and E to the element Sn.

In at least one embodiment of the luminophore, RE is selected from the group formed by the following elements and the combinations of the following elements: Cr, Ni and Sn. RE may include or consists of chromium. RE may include or consists of nickel and tin.

In at least one embodiment of the luminophore, RE is selected from the group formed by the following elements and combinations of two or three of the following elements: Ni, Sn and Cr. In an embodiment, RE includes or consists of nickel and tin, or nickel, tin and chromium.

In at least one embodiment of the luminophore, RE is selected from the group formed by the following elements and the combinations of the following elements: Ni and Sn. Nickel may have a double positive charge and tin a quadruple positive charge. In an embodiment, Ni and Sn are present simultaneously as dopants in the present luminophore. The combination of nickel and tin as dopant achieves a particularly high photoluminescence quantum yield.

In at least one embodiment of the luminophore, A is selected from the group formed by the following elements and the combinations of the following elements: Y, La, Ce, Pr, Nd, Sm, Eu, Gd, Tb, Dy, Ho, Tm, Yb and Lu. In an embodiment, A is lanthanum.

In at least one embodiment of the luminophore, M is selected from the group formed by the following elements and the combinations of the following elements: Ga, Sc, Al, In, Sb, Bi, As and Lu. For example, M includes solely Lu when A does not comprise any Lu. In an embodiment, M is gallium, scandium or a combination of gallium and scandium. Owing to similar ionic radii of scandium and gallium, the formation of a solid solution having the formula $A(Sc,Ga)X_3$ is possible.

In at least one embodiment of the luminophore, M includes at least two elements of the following group: Ga, Sc, Al, In, Sb, Bi and As. In an embodiment M includes Ga and Sc. For example M consists of Ga and Sc.

In at least one embodiment of the luminophore X is selected from the group formed by the following elements and the combinations of the following elements: O, S, Se, Te and Po. For example, X includes exactly two of these elements. In an embodiment, X is exclusively oxygen.

In at least one embodiment the luminophore has the general formula La $(Ga_xSc_{1-x})O_3$:Ni Sn where $0 \leq x \leq 1$. In an embodiment nickel and tin each occupy a stoichiometric proportion between 0.001 and 0.1 inclusive of the point positions of gallium scandium and/or lanthanum. In other words such as between 0.1% and 10% of the point positions that are intended for scandium and/or lanthanum and/or gallium in the La $(Ga_xSc_{1-x})O_3$ host material are occupied by nickel or tin.

The general formula La $(Ga_xSc_{1-x})O_3$:Ni, Sn may include either solely gallium or solely scandium. For example, the luminophore thus has the formula $LaGaO_3$:Ni, Sn or $LaScO_3$:Ni, Sn.

The compounds $LaGaO_3$ and $LaScO_3$ that are analogous to the luminophores $LaGaO_3$:Ni, Sn and $LaScO_3$:Ni,Sn have a host material having the same crystal structure. The compound having the formula $LaScO_3$ crystallizes, for example, isotypically with the compound of the formula $LaGaO_3$. What is meant by the term "isotypical" is that the compounds have the same crystal structure. Thus, the luminophore $LaGaO_3$:Ni,Sn and the luminophore $LaScO_3$:Ni, Sn likewise have the same crystal structure.

In at least one embodiment, the luminophore has the general formula La $(Ga_xSc_{1-x})O_3$:Ni, Sn where $0<x<1$. Gallium is present here in the luminophore in combination with scandium.

In at least one embodiment of the luminophore, the number of Ni atoms corresponds to the number of Sn atoms. The replacement of $Sc^{3+}$ or $Ga^{3+}$ by $Ni^{2+}$ in combination with $Sn^{4+}$ may lead to balancing of the charge in the general formula La $(Ga_xSc_{1-x})O_3$:Ni,Sn.

In at least one embodiment of the luminophore, a host material of the luminophore has a crystal structure corresponding to a distorted perovskite structure type. The M cations are surrounded here by six X anions in the form of $MX_6$ octahedra. These $MX_6$ octahedra form a three-dimensional network via common vertices. The A cations are present in the interstices of this network, and these have a coordination sphere of 12 X atoms in the form of a cuboctahedron as coordination polyhedron. If gallium and scandium are used as M, on account of the similarity of scandium and gallium, a solid solution is produced as a result of partial replacement in the octahedron position. On account of the slightly different ionic radii of scandium and gallium, this formation of a solid solution leads to variation in the lattice parameters a, b and c depending on the degree of replacement. The three lattice parameters a, b and c are the lengths of the lattice vectors that form the unit cell. The specific adjustment of the ligand field in the octahedron position is thus enabled. If, for example, the luminophore having the general formula La $(Ga_xSc_{1-x})O_3$:RE has replacement of nickel in the octahedron position, the emission wavelength of the d-d transitions in the nickel ion is influenced via the Sc/Ga ratio.

In at least one embodiment, the host material has symmetry in a space group no. 62. Space group no. 62 is one of the orthorhombic space groups. The host material can be described in space group no. 62 or one of its subgroups. The host material may have the space group Pbnm.

In at least one embodiment, the luminophore has an excitation spectrum having an excitation maximum between 400 nanometers and 500 nanometers inclusive and/or an excitation maximum between 600 nanometers and 750 nanometers inclusive. The excitation spectrum may have an excitation maximum between 400 nanometers and 430 nanometers inclusive. The luminophore may absorb electromagnetic radiation at the excitation maximum of the excitation spectrum.

In at least one embodiment, the luminophore has an emission spectrum in a range between 1000 nanometers and 1800 nanometers inclusive. The emission spectrum may range between 1100 nanometers and 1700 nanometers inclusive.

The emission spectrum of the distribution of the electromagnetic radiation emitted by the luminophore. Typically, the emission spectrum is represented in the form of a diagram in which a spectral intensity or a spectral luminous flux per wavelength interval ("spectral intensity/spectral luminous flux") of the electromagnetic radiation emitted by the luminophore or another radiation-emitting element is shown as a function of wavelength $\lambda$. In other words, the emission spectrum is a curve in which the wavelength is plotted on the x axis and the spectral intensity or spectral luminous flux on the y axis.

In at least one embodiment, the luminophore has an emission spectrum having an emission maximum at a wavelength between 1200 nanometers and 1500 nanometers inclusive. The emission maximum of the emission spectrum corresponds to the maximum intensity of the emission spectrum. In the present context, the emission maximum is ascertained from the emission spectrum.

The emission maximum of the emission spectrum may range between 1240 nanometers and 1460 nanometers inclusive. The emission maximum may move by up to 200 nanometers. The movement of the emission maximum may be adjusted via the Sc/Ga ratio of the luminophore. This leaves the crystal structure unchanged. The higher the scandium content in the luminophore/the further the movement of the emission maximum toward higher wavelengths. The density of the luminophore changes only slightly, for example.

In at least one embodiment, the luminophore has a photoluminescence quantum yield of at least 15%. The photoluminescence quantum yield refers to the ratio between the electromagnetic radiation emitted and the electromagnetic radiation absorbed by the luminophore.

In at least one embodiment, the luminophore has a photoluminescence quantum yield of at least 15% in combination with the emission maximum in one of the abovementioned ranges.

The luminophore may have a photoluminescence quantum yield of at least 19%, with an emission maximum of around 1460 nanometers. The photoluminescence quantum yield is dependent on the dopants. For example, the luminophore with tin and nickel as dopants has a higher photoluminescence quantum yield compared to a luminophore with nickel and niobium as dopants. The use of $Sn^{4+}$ compared to $Nb^{5+}$ as dopants leads, for example, to a photoluminescence quantum yield that is three times higher.

In at least one embodiment, the emission spectrum has a half-height width between 150 nanometers and 220 nanometers inclusive. The excitation spectrum here is in the near ultraviolet to blue spectral region, for example with an excitation maximum of about 450 nanometers. In an embodiment, the half-height width is between 170 nanometers and 200 nanometers inclusive. By varying the Sc/Ga ratio in the luminophore, it is possible to control the half-height width of the emission spectrum.

The term half-height width ("full width at half maximum", abbreviation: "FWHM") relates to a curve having a maximum, for instance an emission maximum, the half-height width being that region on the x axis corresponding to the two y values corresponding to half of the maximum.

The luminophore can be produced by the process described hereinafter. Features and embodiments that are detailed merely in conjunction with the luminophore may also be embodied in the process, and vice versa.

In at least one embodiment of the process for producing a luminophore having the general formula $A_xM_yX_z$:RE, the reactants selected from the following group: chalcogenides of A, chalcogenides of M, chalcogenides of RE. Subsequently, the reactants are heated to a temperature between 1000° C. and 1800° C. inclusive. A is selected from the group of the trivalent cations, M is selected from the group of the trivalent cations and X is selected from the group of the divalent anions and RE is a dopant and is selected from the group formed by the following elements and the combinations of the following elements: Ni, Mn, Cr, Co, Fe and Sn, where $0.8 \leq x \leq 1.2$; $0.8 \leq y \leq 1.2$ and $2.7 \leq z \leq 3.3$. The reactants may be selected from the following group: oxides of A, oxides of M and oxides of RE.

In at least one embodiment of the process for producing the luminophore, A is selected from the group of the trivalent cations and combinations thereof, M is selected from the group of the trivalent cations and combinations thereof, X is selected from the group of the divalent anions and combinations thereof, and RE is a dopant and is selected from the group formed by the following elements and the combinations of the following elements: Ni, Mn, Cr, Co, Fe and Sn, where $0.8 \leq x \leq 1.2$; $0.8 \leq y \leq 1.2$ and $2.7 \leq z \leq 3.3$.

In at least one embodiment of the process, the reactants are homogenized in a first step.

In one embodiment of the process, the mixture formed from the reactants is introduced into a civil, such as into a corundum crucible. The mixture of the reactants is, for example, heated to a temperature of about 1400° C. for four hours under an air, nitrogen or forming gas atmosphere or a mixture of the types of gas listed in order to form a reaction product. The forming gas atmosphere includes, for example, a mixture of nitrogen or argon with up to 10% hydrogen, or is formed from such a mixture.

In at least one embodiment of the process, the cooled reaction product is comminuted, for example ground with a mortar mill, and then sieved.

In at least one embodiment, reactants provided in the process for producing the luminophore are lanthanum oxide, nickel oxide, tin oxide, scandium oxide and/or gallium oxide.

In at least one embodiment, a mineralizer is added to the reactants. Mineralizers are compounds that promote the crystal growth of the target compound. Mineralizers used are especially chlorine or fluorine compounds, for example of alkali metal or alkaline earth metal elements, and boron compounds and combinations thereof. For example, at least one of the following compounds is added to the reactants as mineralizer: $LiF, LiCl, NaF, NaCl, SrCl_2, SrF_2, CaCl_2, CaF_2, BaCl_2, BaF_2, NH_4Cl, NH_4F, KF, KCl, MgF_2, MgCl_2, AlF_3, H_3BO_3, B_2O_3, Li_2B_4O_7, NaBO_2, Na_2B_4O_7, LiBF_4$.

The luminophore is especially suitable and intended for use in an optoelectronic component. Features and embodiments that are detailed merely in conjunction with the luminophore and/or the process may also be embodied in the optoelectronic component, and vice versa in each case.

In at least one embodiment, the optoelectronic component comprises a semiconductor chip which, in operation, emits electromagnetic radiation of a first wavelength range from a radiation exit face.

In at least one embodiment, the optoelectronic component includes a luminophore as described here. The first wavelength range may be all or part of the excitation spectrum of the luminophore. The luminophore converts electromagnetic radiation in the first wavelength range for the or partly to the electromagnetic radiation in a second wavelength range. The electromagnetic radiation in the second wavelength range may be different than the first wavelength range. The electromagnetic radiation in the second wavelength range forms the emission spectrum of the luminophore.

The semiconductor chip is, for example, a light-emitting diode chip or a laser diode chip. The semiconductor chip may have an epitaxially grown semiconductor layer sequence having an active zone set up to generate electromagnetic radiation. For this purpose, the active zone has, for example, a pn junction, a double-header structure, a single quantum well structure or, such as, a multiple quantum well structure. The semiconductor chip in operation may emit electromagnetic radiation from the ultraviolet spectral region and/or from the visible spectral region, such as from the blue spectral region.

In a further embodiment, the optoelectronic component has a conversion element including a luminophore as described here. The luminophore generally imparts wavelength-converting properties to the conversion element. In an embodiment/particles of the luminophore described here with a different Sc/Ga content are embedded in the conversion element.

The conversion element, as well as the luminophore described here, may include a matrix material in which the luminophore is embedded in the form of particles. The matrix material may be selected from the group of the polysiloxanes, epoxides, glasses and hybrid materials. For example, a further luminophore has been introduced into the matrix material. The further luminophore is, for example, a garnet luminophore or a nitride luminophore. The garnet luminophore is, for example, $Y_3Al_5O_{12}$:Ce, and a nitride luminophore is, for example, (Sr,Ca)AlSiN$_3$:Eu. The luminophore may also be used in the form of a ceramic as conversion element.

In at least one embodiment, the conversion element consists of the luminophore described here. For example, the conversion element, like the luminophore, is in ceramic form.

For example, the conversion element converts the electromagnetic radiation from the semiconductor chip merely partly to the electromagnetic radiation of the second wavelength range, while a further portion of the electromagnetic radiation from the semiconductor chip is transmitted or scattered by the conversion element. The optoelectronic component in this case may emit polychromatic radiation composed of electromagnetic radiation of the first wavelength range and electromagnetic radiation of the second wavelength range.

The optoelectronic component is especially suitable and intended for use in an NIR spectrometer. Features and embodiments that are detailed merely in conjunction with the optoelectronic component and/or the luminophore and/or the process may also be embodied in the NIR spectrometer, and vice versa in each case.

In at least one embodiment, an NIR spectrometer includes an optoelectronic component as described here. The optoelectronic component may emit electromagnetic radiation in the near infrared region. The semiconductor chip here may emit the electromagnetic radiation in the blue and/or red wavelength range. The luminophore converts a majority of the electromagnetic radiation in the first wavelength range to electromagnetic radiation in the infrared wavelength range. The aim is full conversion of the electromagnetic radiation in the first wavelength range.

The luminophore may emit electromagnetic radiation in the wavelength range from 1000 nanometers to 1800 nanometers inclusive. The luminophore is thus of particularly good suitability for use in NIR spectrometers. NIR spectroscopy is an important analysis method for determination of optical properties of organic compounds, for example foods and pharmaceuticals or gases and solids. By virtue of the optical excitation of vibration states in organic compounds or gases and the optical excitation of electronic states in solids with the aid of electromagnetic radiation in the infrared wavelength range, material-specific reflection and absorption properties are shown. These material-specific optical properties are in the non-visible spectral region and hence are not amenable to the human eye. The NIR spectrometer makes it possible to detect these substances and to quantify the relative concentrations thereof. For example, the broad range of the emission spectrum of the component described makes it possible to cover the shorter-wave absorbing harmonics of the C—H valence vibrations at around 1350 nanometers to 1450 nanometers. It is additionally advantageous that the emission spectrum can be controlled via the Sc/Ga ratio.

One concept in the present optoelectronic component is to generate electromagnetic radiation in the region of the emission spectrum between 1000 nanometers and 1800 nanometers. The broad wavelength range of the emission spectrum in the NIR region covers the region in which vibration states of numerous organic compounds, gases and solids are excited. It is thus possible to detect selected substances and quantify the relative concentration thereof.

In addition, unexpectedly high variability of the emission spectrum is possible through controlled variation of the M cations, for example via variation of the Sc/Ga ratio of the luminophore. At the same time, there is only very little change, if any, in the host material of the luminophore. There is also only slight variation in the material properties of the luminophore, such as density, particle shape, sedimentation properties, sensitivity to moisture. This shows great advantages in the case of common processing to give a luminophore mixture for broadband light sources.

Compared to quantum well luminophores, the luminophore is described here are nontoxic and insensitive. This leads to simplify further processing and simplified storage, for example under air.

In addition, the optoelectronic component has a lower space demand than comparable thermal emitters, for example tungsten-halogen lamps. Moreover, the optoelectronic component described here achieves lower evolution of heat.

In addition, the operating voltage of the optoelectronic component is comparatively low, and spatially directed emission of electromagnetic radiation is possible. The optoelectronic component may additionally be more variable, more compact and much less costly than a combination of multiple narrowband-emitting NIR LEDs or NIR laser diodes.

BRIEF DESCRIPTION OF THE DRAWINGS

Further advantageous embodiments and developments of the luminophore, the component, the NIR spectrometer and the process will be apparent from the working examples described hereinafter in conjunction with the figures.

The Figures Show.

DETAILED DESCRIPTION

Figure 1A:
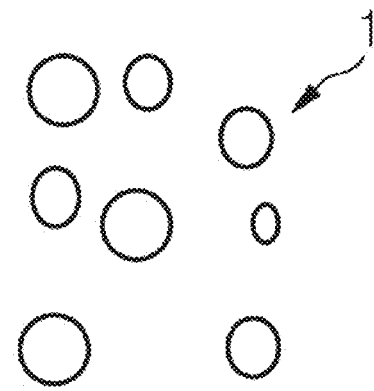
FIG. 1A a schematic section diagram of a multitude of particles of a luminophore in one working example.

Elements that are the same, of the same type or have the same effect are given the same reference numerals in the figures. The figures and the size ratios of the elements shown in the figures should not be considered to be true to scale. Instead, individual elements, especially layer thicknesses, may be shown as being excessively large for better illustratability and/or for better understanding.

FIG. 1A shows a schematic section diagram of a multitude of particles of a luminophore 1 in one working example. A grain size of the particles of the luminophore 1 varies from 1 micrometer to 50 micrometers inclusive. The luminophore has the general formula $A_xM_yX_z$:RE where A is selected from the group of the trivalent cations, M is selected from the group of the trivalent cations, X is selected from the group of the divalent anions and RE is a dopant and is selected from the group formed by the following elements and combinations of the following elements: Ni, Mn, Cr, Co, Fe and Sn, and where $0.8 \le x \le 1.2$; $0.8 \le y \le 1.2$ and $2.7 \le z \le 3.3$.

In the present case, the luminophore 1 has the formula La $(Ga_xSc_{1-x})O_3$:Ni, Sn where x may assume a value between 0 and 1 inclusive. The number of nickel atoms in luminophore 1 corresponds here to the number of tin atoms. A host material of luminophore 1 has a crystal structure corresponding to a distorted perovskite structure type. In addition, the crystal structure of the host material may be described by a space group no. 62 or one of its subgroups.

Figure 1B:
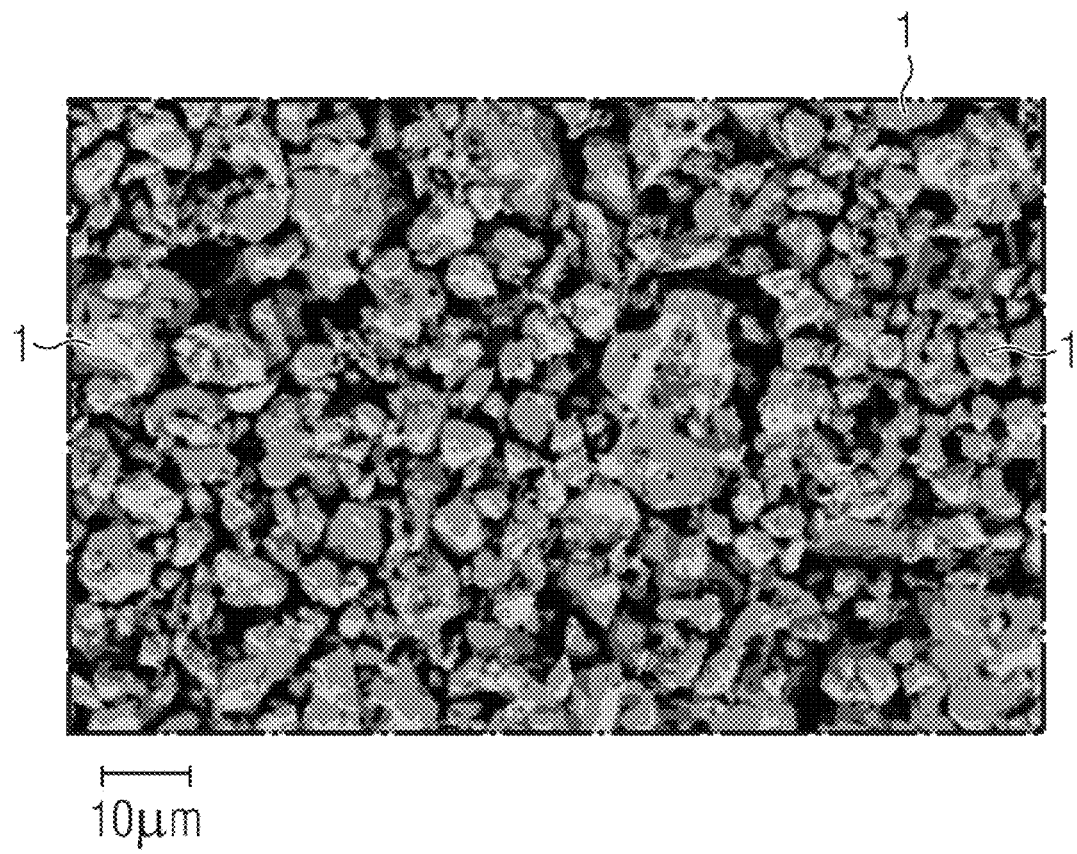
FIG. 1B an illustrative scanning electron micrograph of a multitude of particles of a luminophore in one working example.

FIG. 1B shows, by way of example, a scanning electron micrograph of a detail of a luminophore 1 of the general formula $A_xM_yX_z$:RE in one working example. In the present case, the luminophore 1 has the formula $LaScO_3$:Ni,Sn. The luminophore 1 is in particle form with a grain size between 1 micrometer and 20 micrometers inclusive.

Figure 2:
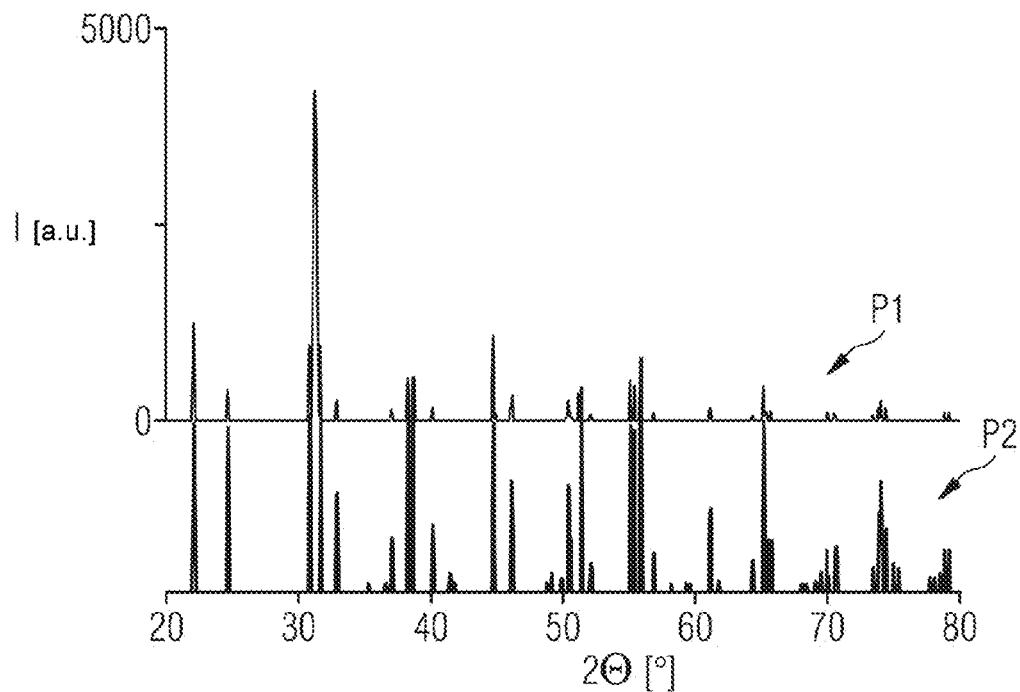
FIG. 2 a powder diffractogram of the luminophore $LaScO_3$:Ni,Sn in one working example.

FIG. 2 shows, by way of example, the powder diffractogram P1 of the luminophore 1 having the formula $LaScO_3$:Ni, Sn, measured using copper-$K_{\alpha 1}$ radiation with a wavelength of 154.06 pm. The intensity I here is plotted in arbitrary units, in each case against the diffraction angle $2\theta$ in degrees between a radiation source of the x-radiation, the luminophore 1 and a detector for the x-radiation. In addition, FIG. 2 shows, in the section of the powder diffractogram P2, the theoretical reflection positions of an $LaScO_3$ perovskite as comparative curve. The good agreement of P1 and P2 and a Rietveld refinement of the diffractogram P1 using the structure data of $LaScO_3$, which crystallizes in space group no. 62, confirm the presence of a distorted perovskite structure for luminophore 1.

Figure 3:
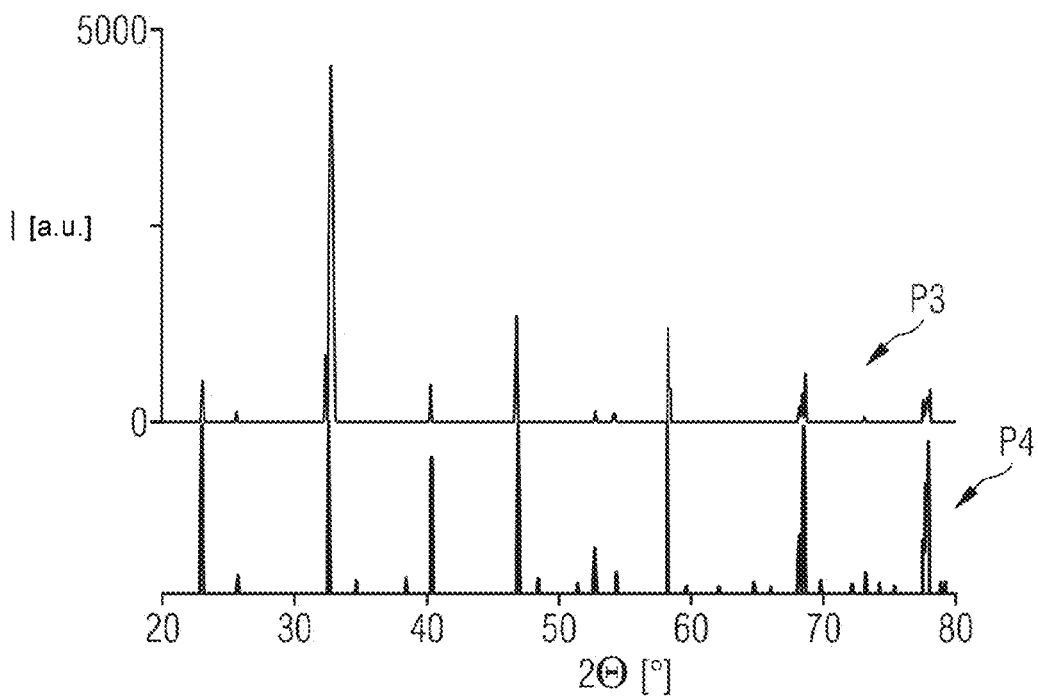
FIG. 3 a powder diffractogram of the luminophore $LaGaO_3$:Ni,Sn in one working example.

FIG. 3 also shows, by way of example, the powder diffractogram P3 measured using copper-$K_{\alpha 1}$ radiation with a wavelength of 154.06 pm. In this case, P3 shows the powder diffractogram of the luminophore $LaGaO_3$:Ni,Sn by way of example. In addition, FIG. 3 shows, in the section of the powder diffractogram P4, the theoretical reflection positions of an $LaGaO_3$ perovskite as comparative curve. The good agreement of P3 and P4 and a Rietveld refinement of the diffractogram P3 using the structure data of $LaGaO_3$, which crystallizes in space group no. 62, confirm the presence of a distorted perovskite structure for luminophore 1.

Figure 4:
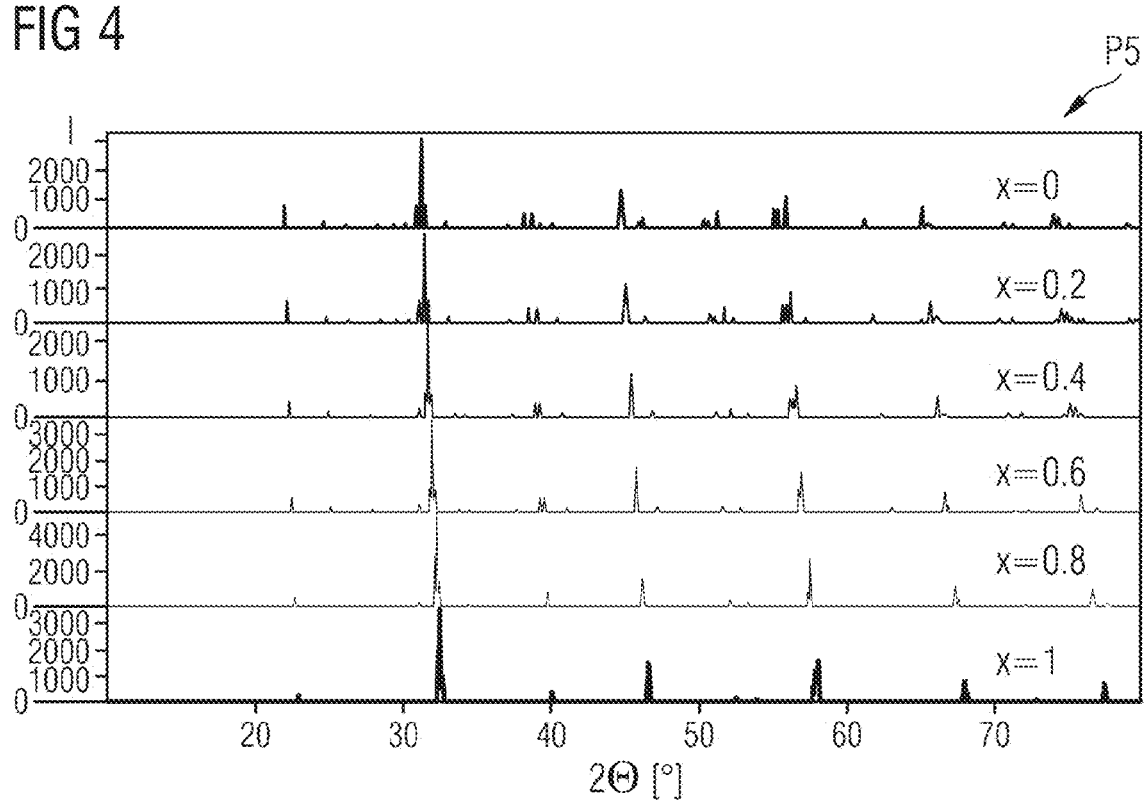
FIG. 4 powder diffractograms of luminophores $La(Ga_xSc_{1-x})O_3$:Ni,Sn having different proportions of gallium and scandium in one working example.

FIG. 4 shows, by way of example, powder diffractograms P5 of the luminophore La $(Ga_xSc_{1-x})O_3$:Ni,Sn. Intensity I is plotted here in arbitrary units against the angle $2\theta$ in degrees. The powder diffractograms P5 of La $(Ga_xSc_{1-x})O_3$:Ni, Sn have different proportions x of gallium and scandium (proportion: 1−x). From the top downward, the proportion 1−x of scandium in luminophore 1 decreases and the proportion x of gallium increases. The more gallium is present in the luminophore 1, the greater the shift in the reflections to larger angles $2\theta$. The reason for the shift to larger angles $2\theta$ is the smaller ionic radius of the gallium.

Figure 5:
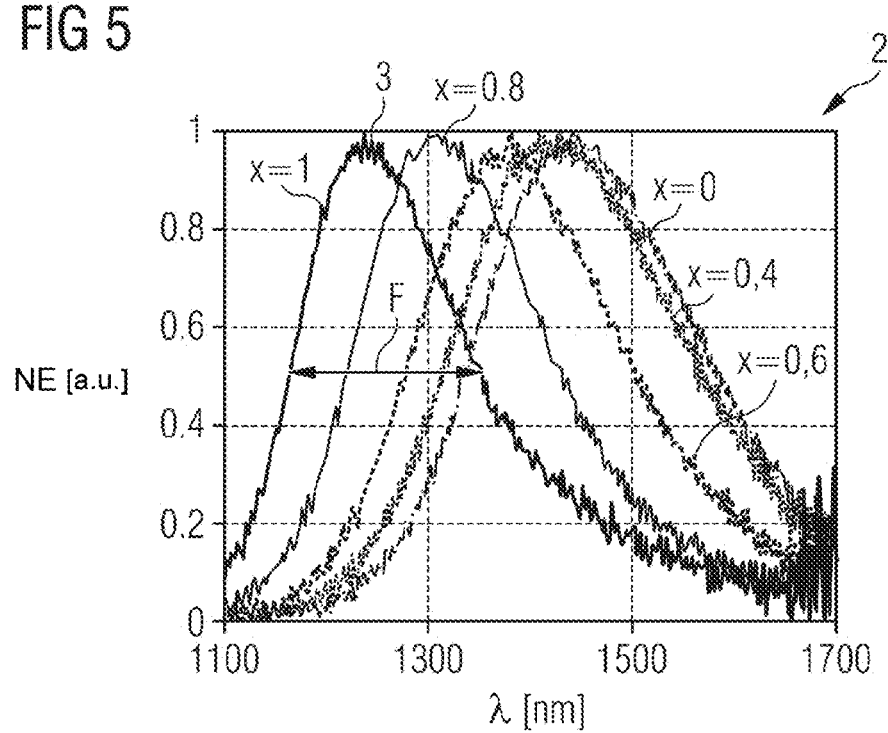
FIG. 5 emission spectra of La $(Ga_xS_{1-x})O_3$:Ni,Sn with different Sc/Ga ratios in one working example on excitation with electromagnetic radiation in an excitation spectrum having an excitation maximum at a wavelength of about 450 nanometers.

FIG. 5 shows, by way of example, five emission spectra 2 of the luminophore $La(Ga_xSc_{1-x})O_3$:Ni,Sn with different Sc/Ga ratios on excitation with electromagnetic radiation in an excitation spectrum having an excitation maximum at a wavelength of 450 nanometers. What is shown here is the normalized emission NE of the electromagnetic radiation emitted by the luminophore 1 as a function of wavelength λ.

The wavelength of an emission maximum 3 in the emission spectrum 2 in the present case is between 1200 nanometers and 1500 nanometers inclusive. The emission spectrum 2 have a half-height width F between 150 nanometers and 260 nanometers inclusive. In addition, a value of a photoluminescence quantum yield in one of the emission spectra 2 is at least 15%. The range of the emission spectra 2 is between 1000 nanometers and 1800 nanometers inclusive. The more scandium is present in the luminophore 1, the further the shift in the emission maximum 3 to greater wavelengths λ. When x is 1, i.e. when no scandium is present in the luminophore 1, the emission maximum 3 is about 1250 nanometers. The emission maximum 3 thus depends significantly on the Sc/Ga ratio. Variation of the Sc/Ga ratio enables a shift in the emission maximum 3 of up to 200 nanometers.

Figure 6:
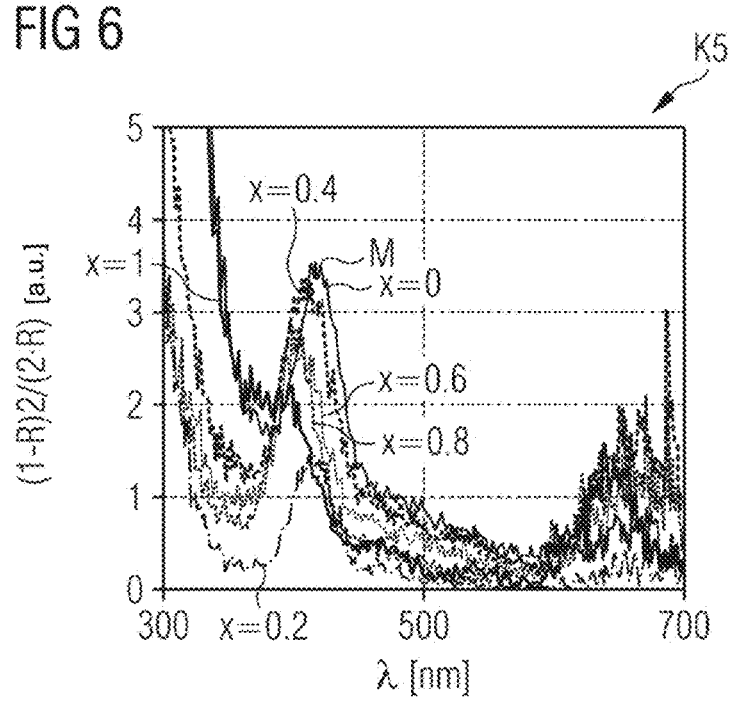
FIG. 6 Kubelka-Munk functions of luminophores La $(Ga_xSc_{1-x})O_3$:Ni,Sn with different Sc/Ga ratios in one working example.

FIG. 6 shows, by way of example, Kubelka-Munk functions K5 calculated from reflectance spectra for the luminophore 1 having the formula La $(Ga_xSc_{1-x})O_3$:Ni, Sn as a function of wavelength λ. The value of the Kubelka-Munk function K5 describes the ratio of absorption and scatter of the incident electromagnetic radiation at the respective wavelength. The calculation here involves an abstract absorption component $(1-R)^2$ and an abstract scatter component $2R$. The plot here is of $(1-R)^2/(2*R)$ against wavelength $\lambda$. R here denotes reflectance. Reflectance means spatially diffuse reflection as a function of wavelength, measured here in the wavelength range from 300 nanometers to 700 nanometers. $(1-R)^2/(2*R)$ corresponds to the Kubelka-Munk value. The Kubelka-Munk functions K5 have a maximum M at a wavelength $\lambda$ of about 410 nanometers to 430 nanometers and only reach a minimum for wavelengths A greater than 550 nanometers. Thus, the luminophore 1 can be excited efficiently with semiconductor chips that emit electromagnetic radiation of an excitation spectrum having an excitation maximum at a wavelength of 400 nanometers to 500 nanometers and 600 nanometers to 750 nanometers.

FIG. 6 shows the progressions of the Kubelka-Munk functions K5 for six different luminophore compositions. Each curve corresponds to a luminophore 1 with a different ratio of gallium and scandium. The more scandium is present in luminophore 1, the further the shift in the maximum M of the Kubelka-Munk function K5 to greater wavelengths $\lambda$. If there is no scandium present in the luminophore 1, i.e. when x is 1, the maximum M of the Kubelka-Munk function K5 is shifted to shorter wavelengths.

Figure 7:
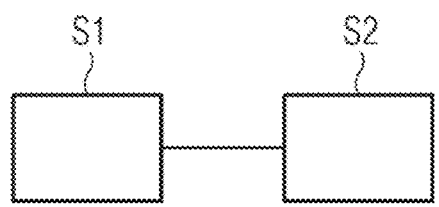
FIG. 7 a schematic section diagram of various process stages in a process for producing a luminophore in one working example.

In the process according to working example of FIG. 7, in a first process step S1, the nickel oxide, lanthanum oxide, tin oxide, boric acid, scandium oxide and/or gallium oxide reactants are provided. The reactants are mixed homogeneously. Subsequently, the mixture is introduced into an open corundum crucible, which is introduced into a tubular furnace.

In a second process step S2, the mixture is heated under a forming gas atmosphere ($N_2:H_2=92,5:7,5$) or under a nitrogen atmosphere at a temperature of 1400° C. for four hours to form the reaction product. Subsequently, the cooled reaction product is comminuted, ground with a mortar mill and then sieved. Corresponding ratios of individual reactants to one another are shown by way of example in table 1. It is optionally possible to reduce the amount of scandium oxide and to add gallium oxide instead.

TABLE 1

Reactants for the synthesis of luminophore 1.
Luminophore 1

| Reactant | Molar amount [mmol] | Mass [g] |
| --- | --- | --- |
| Lanthanum oxide | 106.3 | 34.62 |
| Scandium oxide | 106.2 | 14.65 |
| Nickel oxide | 2.1 | 0.16 |
| Tin oxide | 2.1 | 0.32 |
| Boric acid | 4.0 | 0.25 |

Figure 8:
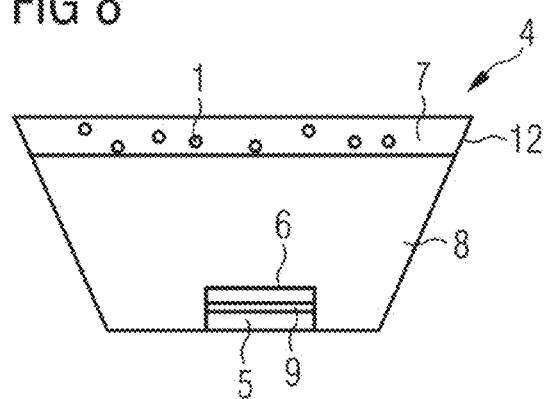
FIGS. 8 and 9 in each case a schematic section diagram of an optoelectronic component in one working example each.
Figure 9:
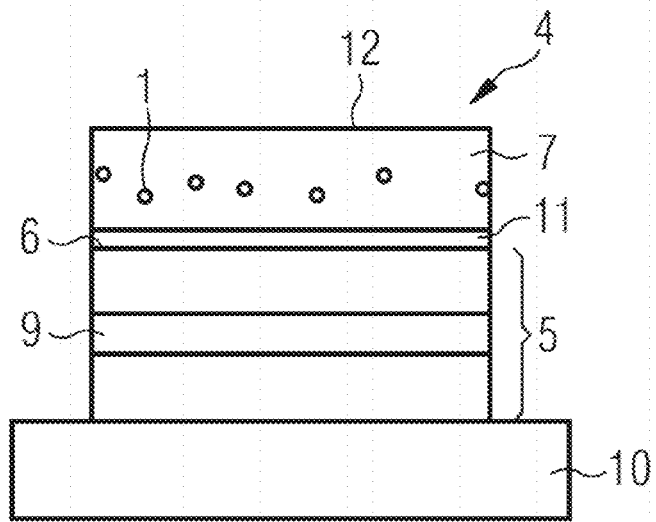

The optoelectronic component according to each of the working examples of FIGS. 8 and 9 has a semiconductor chip 5 which, in operation, emits electromagnetic radiation of a first wavelength range from a radiation exit face 6. The electromagnetic radiation of the first wavelength range has an emission spectrum, which is also referred to as emission spectrum of the semiconductor chip 5. The semiconductor chip 5 comprises an epitaxially grown semiconductor layer sequence having an active zone 9 capable of generating electromagnetic radiation.

In addition, the optoelectronic component 4 according to the working example of FIG. 8 has an encapsulation 8. The encapsulation 8 is transparent to electromagnetic radiation emitted by the active zone 9. The semiconductor chip 5 is surrounded by the encapsulation 8.

The optoelectronic component 4 likewise has a conversion element 12 with a luminophore 1 that converts electromagnetic radiation of the first wavelength range to electromagnetic radiation of a second wavelength range. The electromagnetic radiation of the second wavelength range has an emission spectrum 2 which is also referred to as emission spectrum 2 of the luminophore 1. The luminophore 1 is embedded into a matrix material 7 in the form of particles. The matrix material 7 is selected from the group of polysiloxanes. The conversion element 12 may take the form of a conversion layer. Various luminophores may be introduced into the conversion element 12. For example, a multitude of luminophores 1 with different Sc/Ga ratios is embedded in the conversion element 12.

The optoelectronic component 4 according to the working example of FIG. 9 comprises a semiconductor chip 5, a carrier element 10, an adhesive layer 11 and a conversion element 12. The conversion element 12 is secured on a radiation exit face 6 of the semiconductor chip 5 with the aid of an adhesive layer 11. The opposite face of the semiconductor chip 5 from the radiation exit face 6 is secured on the carrier element 10 for stabilization. The conversion element 12 takes the form of a conversion layer and includes a luminophore 1 embedded into the matrix material 7 in the form of particles. In addition, further luminophores may be embedded into the conversion element 12. The further luminophore is, for example, a garnet luminophore or a nitride luminophore. The garnet luminophore is, for example, $Y_3Al_5O_{12}$:Ce, and the nitride luminophore is, for example, $(Sr,Ca)AlSiN_3$:Eu. It is also possible for a multitude of luminophores 1 with different Sc/Ga ratios to have been introduced into the conversion element.

Figure 10:
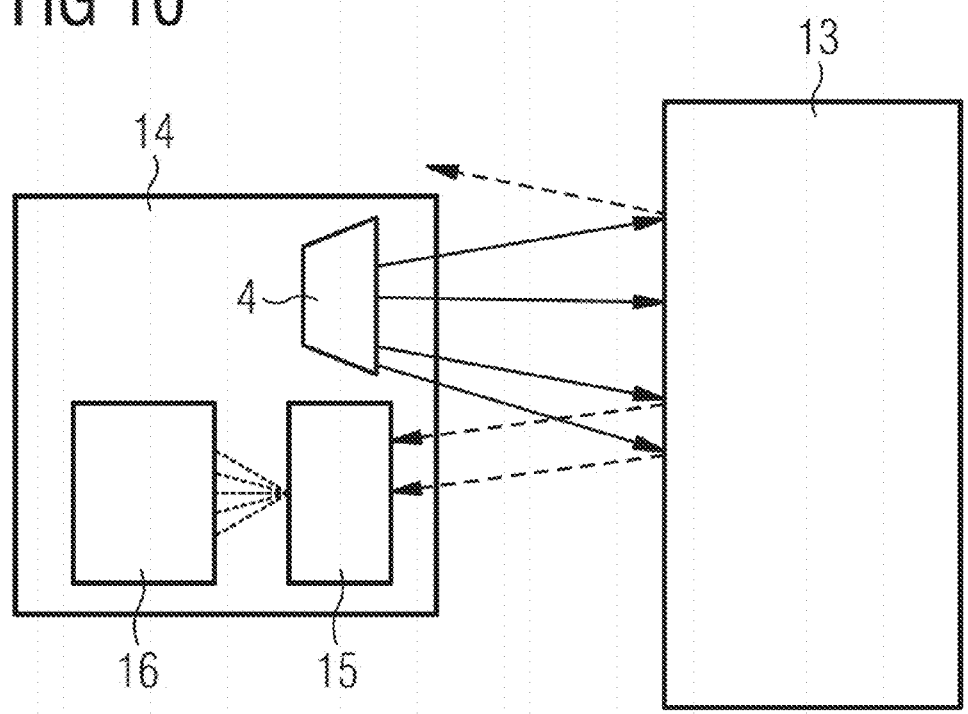
FIG. 10 a schematic section diagram of an NIR spectrometer in one working example.

The NIR spectrometer 14 according to the working example of FIG. 10 comprises an optoelectronic component 4 as already described, for example, with reference to FIGS. 8 and 9. The optoelectronic component 4 has been introduced into a housing. The optoelectronic component 4 is intended to emit electromagnetic radiation in the near infrared region and hence to optically excite selected substances 13. Material-specific reflection and absorption properties of the selected substances 13 are found.

For detection of the reflection and absorption properties of the selected substances 13, the NIR spectrometer 14 also comprises a dispersive, frequency-selective element 15 and a detector element 16. The dispersive, frequency-selective element 15 is, for example, a diffraction grating or a prism. The detector element 16 is, for example, a CCD sensor (CCD=charge-coupled device).

Figure 11:
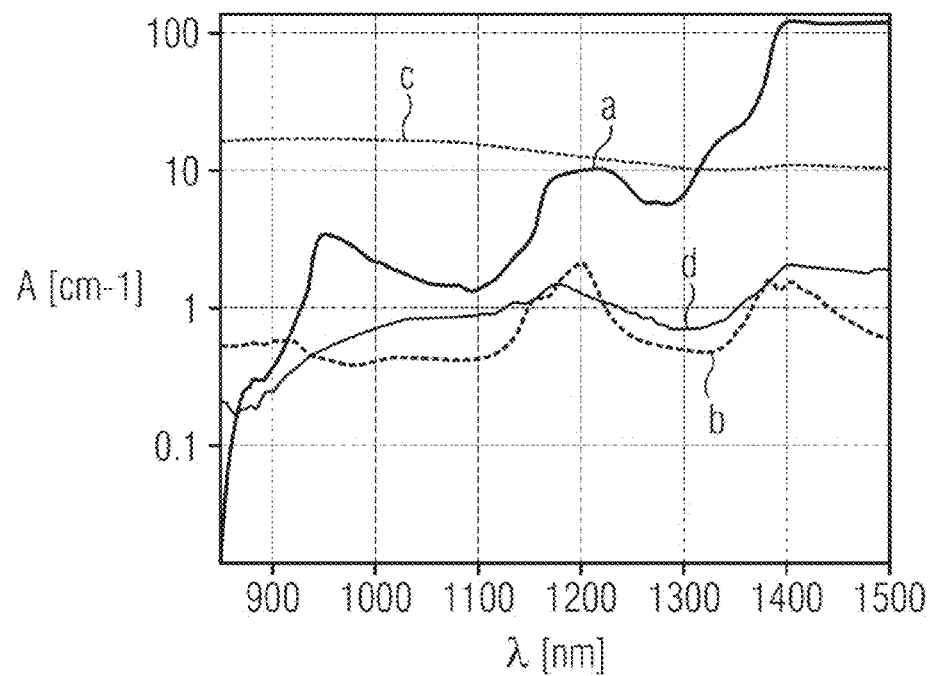
FIG. 11 absorption spectra of water, lipids, hemoglobin and protein in the near-infrared wavelength region, and FIG. 12 difference spectra of fat, water, protein and glucose in the near-infrared wavelength region.

FIG. 11 shows, by way of example, the optical absorption A as a function of wavelength $\lambda$ in the range from 850 nanometers to 1500 nanometers of water a, lipids b, hemoglobin c and protein d. For this wavelength range, a particularly good option is the optoelectronic component 4 described here in the NIR spectrometer 14, since the selected substances 13 can be optically excited by the emission from the NIR spectrometer 14. Different absorption properties of the selected substances 13 are found.

Figure 12:
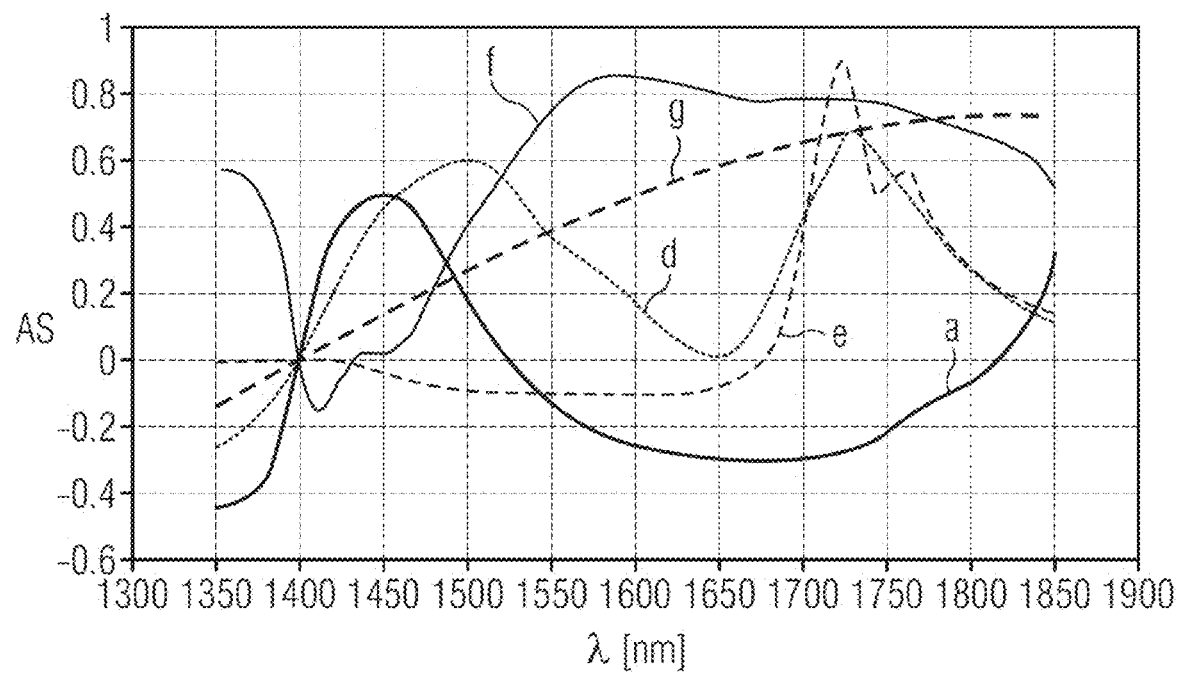

FIG. 12 shows difference spectra of characteristic absorptions AS as a function of wavelength A in the near infrared spectral region up to 1850 nanometers. What are shown are the absorption curves for water a, fat e, protein d and glucose f. The reference shown is a baseline g. The described optoelectronic component 4 in the NIR spectrometer 14 is of particularly good suitability for excitation of selected substances 13 since the selected substances 13 can be optically excited by the emission of the luminophore described here. In addition, the luminophore described here offers the option of controlling the spectral position of the emission or extending it by skillful mixing of variants of the luminophore described here having different Sc/Ga ratios, by means of which it is possible to cover absorptions of a wide variety of different molecular vibrations and solid-state absorptions with just one optoelectronic component 4. Thus, it is especially possible to cover the short-wave absorbing harmonics of the CH valence vibration of CH, $CH_2$ or $CH_3$ groups between 1350 nanometers and 1450 nanometers.

The invention is not limited to the working examples by the description with reference thereto. Instead, the invention encompasses any new feature and any combination of features, which especially include any combination of features in the claims, even if this feature or this combination itself is not specified explicitly in the claims or working examples.

LIST OF REFERENCE NUMERALS 1 luminophore
2 emission spectrum
3 emission maximum
4 optoelectronic component
5 semiconductor chip
6 radiation exit face
7 matrix material
8 encapsulant
9 active layer
10 carrier element
11 adhesive layer
12 conversion element
13 selected substances
14 NIR spectrometer
15 dispersive, frequency-selective element
16 detector element
I intensity
a.u. arbitrary unit
P1 powder diffractogram of $LaScO_3$:Ni,Sn
P2 powder diffractogram of $LaScO_3$
P3 powder diffractogram of $LaGaO_3$:Ni,Sn
P4 powder diffractogram of $LaGaO_3$
P5 powder diffractogram of $La(Ga_xSc_{1-x})O_3$:Ni,Sn
F half-height widths
E normalized emission
K5 Kubelka-Munk function of $La(Ga_xSc_{1-x})O_3$:Ni,Sn
R reflectance
M maximum
S1 process step 1
S2 process step 2
A absorption
AS absorption
a water
b lipid
c hemoglobin
d protein
e fat
f glucose
g baseline

The invention claimed is:

1. A luminophore comprising the general formula $A_xM_yX_z$:RE; wherein:
   A is selected from a group of trivalent cations;
   M is selected from the group of the trivalent cations and includes at least two elements selected from the following group: Ga, Sc, Al, In, Sb, Bi, As, and Lu;
   X is selected from a group of divalent anions; and
   RE is a dopant and is selected from the group: Ni, Mn, Cr, Co, Fe, Sn, and combinations thereof; wherein:

$0.8 \leq x \leq 1.2$, $0.8 \leq y \leq 1.2$, and $2.7 \leq z \leq 3.3$.

2. The luminophore as claimed in claim 1, comprising the general formula $A_xM_yD_dE_eF_fX_z$;
   wherein:
   D, E, and F are selected from the group formed by the following elements: Ni, Mn, Cr, Co, Fe, and Sn; and $0.8 \leq y+d+e+f \leq 1.2$, $0 \leq d \leq 0.1; 0 \leq e \leq 0.1; 0 \leq f \leq 0.1$ and $d+e+f > 0$.

3. The luminophore as claimed in claim 1,
   wherein RE is selected from the group: Cr, Ni, Sn, and combinations thereof.
4. The luminophore as claimed in claim 1, wherein RE includes Ni and Sn.
5. The luminophore as claimed in claim 1,
   wherein A is selected from the group: Y, La, Ce, Pr, Nd, Sm, Eu, Gd, Tb, Dy, Ho, Tm, Yb, Lu, and combinations thereof.
6. The luminophore as claimed in claim 1,
   wherein X is selected from the group: O, S, Se, Te, Po, and combinations thereof.
7. The luminophore as claimed in claim 1,
   comprising the general formula $La(Ga_xSc_{1-x})O_3$:Ni,Sn, wherein $0 \leq x \leq 1$.

8. The luminophore as claimed in claim 1,
   wherein the number of Ni atoms corresponds to the number of Sn atoms.
9. The luminophore as claimed in claim 1,
   wherein a host material of the luminophore has a crystal structure corresponding to a distorted perovskite structure type.
10. The luminophore as claimed in claim 9, wherein the host material has a symmetry in a space group no. 62.
11. The luminophore as claimed in claim 1,
    comprising an excitation spectrum having an excitation maximum ranging from 400 nanometers to 500 nanometers inclusive and/or an excitation maximum ranging from 600 nanometers to 750 nanometers inclusive.
12. The luminophore as claimed in claim 1,
    comprising an emission spectrum ranging from 1000 nanometers to 1800 nanometers inclusive.
13. The luminophore as claimed in claim 1,
    comprising an emission spectrum having an emission maximum at a wavelength ranging from 1200 nanometers to 1500 nanometers inclusive.
14. The luminophore as claimed in claim 1,
    comprising a photoluminescence quantum yield of at least 15%.

15. The luminophore as claimed in claim 1,
wherein the emission spectrum has a half-height width ranging from 150 nanometers to 220 nanometers inclusive.

16. An optoelectronic component comprising:
a semiconductor chip configured to emit electronic radiation of a first wavelength range from a radiation exit face; and
a luminophore as claimed in claim 1, wherein the luminophore is configured to convert electromagnetic radiation of the first wavelength range to electromagnetic radiation of a second wavelength range.

17. An NIR spectrometer comprising an optoelectronic component as claimed in claim 16.

18. A process for producing a luminophore having the general formula $A_xM_yX_z$:RE, wherein the method comprises:
providing reactants selected from the following group: chalcogenides of A, chalcogenides of M, chalcogenides of RE, and combinations thereof; and
heating the reactants to a temperature ranging from 1000° C. to 1800° C. inclusive;
wherein:
A is selected from a group of trivalent cations;
M is selected from the group of the trivalent cations;
X is selected from a group of divalent anions; and
RE is a dopant and is selected from the group: Ni, Mn, Cr, Co, Fe, Sn; and combinations thereof; where $0.8 \leq x \leq 1.2$, $0.8 \leq y \leq 1.2$, and $2.7 \leq z \leq 3.3$.

19. The process for producing a luminophore as claimed in claim 18,
wherein the reactants provided are lanthanum oxide, nickel oxide, tin oxide, scandium oxide, gallium oxide, and combination thereof.

20. The process for producing a luminophore as claimed in claim 18,
further comprising adding a mineralizer to the reactants.

* * * * *